(12) United States Patent
Bianchi

(10) Patent No.: US 10,473,703 B2
(45) Date of Patent: Nov. 12, 2019

(54) MULTI-PORT MEASUREMENT TECHNIQUE

(71) Applicant: Advantest Corporation, Tokyo (JP)

(72) Inventor: Giovanni Bianchi, Ehningen (DE)

(73) Assignee: ADVANTEST CORPORATION, Tokyo (JP)

( * ) Notice: Subject to any disclaimer, the term of this patent is extended or adjusted under 35 U.S.C. 154(b) by 362 days.

(21) Appl. No.: 15/182,896

(22) Filed: Jun. 15, 2016

(65) Prior Publication Data

US 2016/0291070 A1 Oct. 6, 2016

Related U.S. Application Data

(63) Continuation of application No. PCT/EP2013/077839, filed on Dec. 20, 2013.

(51) Int. Cl.
| | | |
|---|---|---|
| G01R 27/04 | (2006.01) | |
| G01R 31/08 | (2006.01) | |
| G01R 35/00 | (2006.01) | |
| G06F 19/00 | (2018.01) | |
| G01R 27/28 | (2006.01) | |
| G01R 27/32 | (2006.01) | |

(52) U.S. Cl.
CPC ............ *G01R 27/28* (2013.01); *G01R 27/32* (2013.01)

(58) Field of Classification Search
CPC ........ G01R 27/04; G01R 27/28; G01R 31/08; G01R 35/00; G06F 19/00
See application file for complete search history.

(56) References Cited

U.S. PATENT DOCUMENTS

| | | | |
|---|---|---|---|
| 5,268,636 | A | 12/1993 | Phillips et al. |
| 5,784,299 | A | 7/1998 | Evers et al. |
| 6,188,968 | B1 | 2/2001 | Blackham |
| 6,327,545 | B1 | 12/2001 | Browen et al. |

(Continued)

FOREIGN PATENT DOCUMENTS

| | | |
|---|---|---|
| EP | 0626588 | 11/1994 |
| EP | 0984291 | 3/2000 |

(Continued)

OTHER PUBLICATIONS

Nieuwoudt, I et al., "Algorithms for a Shared Resource Scheduling Problem in Which Some Level of Conflict is Tolerable," Journal of Scheduling, Kluwer Academic Publishers, vol. 15, No. 6, Sep. 29, 2012, pp. 681-702.

(Continued)

*Primary Examiner* — Neel D Shah

(57) ABSTRACT

This invention relates to an apparatus, a method and a computer program for calculating one or more scattering parameters of a linear network, the network including a number of N ports adapted to provide electric connections. The apparatus is configured to calculate, and the method includes calculating, one or more scattering parameters of the linear network, which are related to a reference impedance, on the basis of a measured electrical response at one or more ports of the linear network to an incident wave applied at a port of the linear network, measured under the condition that one or more of other ports of the linear network face a reflection coefficient $\Gamma$ with an amplitude $\rho$ of 0.5 or larger. The computer program is adapted to perform such a method and runs on a computer.

17 Claims, 8 Drawing Sheets

(56) References Cited

U.S. PATENT DOCUMENTS

| | | | |
|---|---|---|---|
| 6,397,160 B1 | 5/2002 | Craig et al. | |
| 6,472,885 B1 | 10/2002 | Green et al. | |
| 6,643,597 B1 | 11/2003 | Dunsmore | |
| 6,795,496 B1 | 9/2004 | Soma et al. | |
| 6,826,506 B2* | 11/2004 | Adamian | G01R 27/28 324/601 |
| 7,061,254 B1* | 6/2006 | Shoulders | G01R 27/28 324/601 |
| 7,075,312 B2 | 7/2006 | Fabry et al. | |
| 7,113,891 B2* | 9/2006 | Anderson | G01R 27/28 702/183 |
| 7,256,585 B1 | 8/2007 | Shoulders | |
| 2003/0208734 A1 | 11/2003 | Coelho, Jr. et al. | |
| 2004/0004466 A1 | 1/2004 | Miyanaga et al. | |
| 2004/0153265 A1* | 8/2004 | Martens | G01R 35/005 702/65 |
| 2005/0050546 A1 | 3/2005 | Remany et al. | |
| 2005/0068068 A1 | 3/2005 | Hall | |
| 2005/0185769 A1 | 8/2005 | Pickerd et al. | |
| 2005/0234662 A1 | 10/2005 | Niedzwiecki et al. | |
| 2006/0217948 A1 | 9/2006 | Humphrey et al. | |
| 2009/0092177 A1 | 4/2009 | Dvorak et al. | |
| 2009/0129129 A1 | 5/2009 | Udagawa | |
| 2009/0272634 A1 | 11/2009 | Ehlers et al. | |
| 2010/0225301 A1 | 9/2010 | Nakayama et al. | |
| 2010/0228515 A1 | 9/2010 | Srinivasan et al. | |
| 2010/0309952 A1 | 12/2010 | Asami | |
| 2010/0312506 A1 | 12/2010 | Taylor | |
| 2011/0227767 A1 | 9/2011 | O'Brien | |
| 2012/0049655 A1 | 3/2012 | Leyendecker et al. | |
| 2012/0221279 A1 | 8/2012 | Zhang | |
| 2013/0006567 A1 | 1/2013 | Horn | |
| 2013/0229068 A1 | 9/2013 | Sanders, III et al. | |
| 2013/0234723 A1 | 9/2013 | Behrens et al. | |

FOREIGN PATENT DOCUMENTS

| | | |
|---|---|---|
| EP | 1298778 | 4/2003 |
| JP | H11038087 | 2/1999 |
| JP | 2000009792 | 1/2000 |
| WO | 99/21025 | 4/1999 |
| WO | 2012/084028 | 6/2012 |
| WO | 2014/135194 | 9/2014 |

OTHER PUBLICATIONS

Liu, Lei, "Finite Automata for Evaluating Testbed Resource Contention," IEEE, Wireless Telecommunications Symposium WTS 2007, Piscataway, NJ, Apr. 26, 2007, pp. 1-6.

Marple, S. Lawrence Jr., "Computing the Discrete-Time 'Analytic' Signal via FFT," IEEE Transactions on Signal Processing, vol. 47, No. 9, Sep. 1, 1999, pp. 2600-2603.

Jamal, Shafiq M. et al., "Calibration of Sample-Time Error in a Two-Channel Time-Interleaved Analog-to-Digital Converter," IEEE Transactions on Circuits and Systems, I: Regular Papers, vol. 51, No. 1, Jan. 1, 2004, pp. 130-139.

Ting, Shang-Kee et al., "An Algorithm to Compensate the Effects of Spurious PLL Tones in Spectrum Sensing Architectures", IEEE Transactions on Circuits and Systems, I: Regular Papers, vol. 59, No. 5, May 1, 2012, pp. 1093-1106.

Sismanoglou, P., et al, "Input Test Data Compression Based on the Reuse of Parts of Dictionary Entries: Static and Dynamic Approaches," IEEE Transactions on Computer-Aided Design of Integrated Circuits and Systems, vol. 32, No. 11, Nov. 2013, pp. 1762-1775.

White, H.E., "Printed English Compression by Dictionary Encoding," Proceedings of the IEEE, vol. 55, No. 3, Mar. 1967, pp. 390-396.

Quintanel, S., et al., "On-Wafer Multi-Port Circuits Characterization Technique with a Two-Port VNA," IEEE 81st ARFTG Microwave Measurement Conference, Seattle, WA, Jun. 7, 2013, pp. 1-4.

Lenk, F., et al., "A New Multiport Measurement-Method Using a Two-Port Network Analyzer," IEEE MTT-S International Microwave Symposium, Jun. 12-17, 2005, pp. 1663-1666.

Kam, D.G., et al., "Multiport Measurement Method Using a Two-Port Network Analyzer With Remaining Ports Unterminated," IEEE Microwave and Wireless Components Letters, vol. 17, No. 9, Sep. 2007, pp. 694-696.

Chen, C.-J., et al., "An Error Analysis of the Scattering Matrix Renormalization Transform," IEEE Transactions on Microwave Theory and Techniques, vol. 57, No. 4, Apr. 2009, pp. 863-868.

Rolfes, I., et al., "Multiport Method for the Measurement of the Scattering Parameters of N-Ports," IEEE Transactions on Microwave Theory and Techniques, vol. 53, No. 6, Jun. 2005, pp. 1990-1996.

* cited by examiner

MULTI-PORT MEASUREMENT TECHNIQUE

CROSS-REFERENCE TO RELATED APPLICATIONS

This application is a continuation of copending International Application No. PCT/EP2013/077839, filed Dec. 20, 2013, which is incorporated herein by reference in its entirety.

Embodiments of the invention refer to an apparatus for calculating one or more scattering parameters of a linear network, to a method for calculating one or more scattering parameters of a linear network, and to a computer program for performing such a method, when the computer program runs on a computer.

BACKGROUND OF THE INVENTION

In general, apparatuses, computer programs, and methods for calculating one or more scattering parameters of a linear network are known. A N-port linear network has many equivalent representations. Two of them are the impedance matrix and the scattering matrix. The first one uses voltage and currents, as illustrated at the linear network in FIG. 8A, and can be more useful for calculations, the latter uses linear combinations of voltage and current at each port, as illustrated at the linear network in FIG. 8B, and is directly measurable, for example at high frequency.

Impedance and scattering parameters of the N-port linear network are often given in a N×N matrix referred to as Z-matrix and S-matrix, or even [Z] and [S], respectively. The matrices comprise the coefficients $z_{hk}$ and $s_{hk}$, respectively, which are complex functions of the frequency. The index h refer to the rows of the matrices and the index k refers to the columns of the matrices. Thus, for example, $z_{hk}$ is the Z-parameter found in the h-th row and the k-th column of the Z-matrix. For each network representation of the N-port linear network, there are three equivalent ways to write the system of N equations with N unknowns. Those are explicit equations (eq. 1 a, 1 b), compact form (eq. 2a, 2b), and matrix form (eq. 3a, 3b) of the impedance and scattering parameters. Thus, the values for $a_k$ and $b_k$, which represent an incident wave and a reflected wave at a port k of the network respectively, follow from the equations shown in eq. 4, wherein $R_0$ is the reference impedance, or normalization impedance of the scattering parameters.

Explicit equations of [Z]

$$\begin{cases} V_1 = z_{11}I_1 + z_{12}I_2 + \ldots + z_{1N}I_N \\ V_2 = z_{21}I_1 + z_{22}I_2 + \ldots + z_{2N}I_N \\ \ldots \\ V_N = z_{N1}I_1 + z_{N2}I_2 + \ldots + z_{NN}I_N \end{cases} \quad \text{(eq. 1a)}$$

Explicit equations of [S]

$$\begin{cases} b_1 = s_{1N}a_1 + s_{1N}a_2 + \ldots + s_{1N}a_N \\ b_2 = s_{21}a_1 + s_{2N}a_2 + \ldots + s_{2N}a_N \\ \ldots \\ b_N = s_{N1}a_1 + s_{N2}a_2 + \ldots + s_{NN}a_N \end{cases} \quad \text{(eq. 1b)}$$

Compact form of [Z]

$$V_k = \sum_{h=1}^{N} z_{kh}I_h, \, (h, k = 1, \ldots N) \quad \text{(eq. 2a)}$$

Compact form of [S]

$$b_k = \sum_{h=1}^{N} s_{kh}a_h, \, (h, k = 1, \ldots N) \quad \text{(eq. 2b)}$$

Matrix form of [Z]

$$\begin{bmatrix} V_1 \\ V_2 \\ \vdots \\ V_N \end{bmatrix} = \begin{bmatrix} z_{11} & z_{12} & \ldots & z_{1N} \\ z_{21} & z_{22} & \ldots & z_{2N} \\ \ldots & \ldots & \ddots & \vdots \\ z_{N1} & z_{N2} & \ldots & z_{NN} \end{bmatrix} \cdot \begin{bmatrix} I_1 \\ I_2 \\ \vdots \\ I_N \end{bmatrix} \quad \text{(eq. 3a)}$$

Matrix form of [S]

$$\begin{bmatrix} b_1 \\ b_2 \\ \vdots \\ b_N \end{bmatrix} = \begin{bmatrix} s_{11} & s_{12} & \ldots & s_{1N} \\ s_{21} & s_{22} & \ldots & s_{2N} \\ \ldots & \ldots & \ddots & \vdots \\ s_{N1} & s_{N2} & \ldots & s_{NN} \end{bmatrix} \cdot \begin{bmatrix} a_1 \\ a_2 \\ \vdots \\ a_N \end{bmatrix} \quad \text{(eq. 3b)}$$

$$a_k = V_k + R_0 I_K, \, b_k = V_k - R_0 I_K, \, (k = 1, \ldots N) \quad \text{(eq. 4)}$$

Relations between voltage ($V_k$) and current ($I_k$) and incident wave ($a_k$) and reflected wave at a port k of the linear network (electrical response/reflected wave, $b_k$)

From the relations between voltage and current and from incident wave and reflected wave, a reflected wave also being called an electrical response, respectively, it is possible to derive conversion formulae for converting [S] to [Z] and vice versa (see eq. 5 for [S] to [Z] & eq. 6 for [Z] to [S]).

$$[Z] = \{[E] - [S]\}^{-1} E] + [S]\} R_0 \quad \text{(eq. 5)}$$

Conversion formula for [S] to [Z]

$$[S] = \{[Z] - [E]R_0 Z] + [Z]R_0\}^{-1} \quad \text{(eq. 6)}$$

Conversion formula for [Z] to [S]

In the conversion formulae, [E] is the N×N unit matrix: the elements on the main diagonal (row index=column index) equal to one, all the remaining elements are zero, as shown in eq. 7.

N × N unit matrix [E]

$$[E] = \begin{bmatrix} 1 & 0 & \ldots & 0 \\ 0 & 1 & \ldots & 0 \\ \ldots & \ldots & \ddots & \vdots \\ 0 & 0 & \ldots & 1 \end{bmatrix} \quad \text{(eq. 7)}$$

As shown in eq. 8, which follows from eq. 2a, the element on the h-th row and k-th column of the impedance matrix is, with regards to its physical meaning, the ratio between the voltage V on the port k and the current I injected on the port h, assuming that no current flows in the remaining ports. Thus, all the ports, excluding h may be left open circuit to determine the respective impedance parameters.

Definition of impedance parameter $z_{kh}$ $$V_k = \sum_{h=1}^{N} z_{kh}I_h, \, (h, k = 1, \ldots N) \quad \text{(eq. 8)}$$

$$\Downarrow$$

$$z_{kh} = \frac{V_k}{I_h}\bigg|, \, (I_m = 0, \, \forall \, m \neq h)$$

Furthermore, as shown in eq. 9, which follows from eq. 2b, the element on the h-th row and k-th column of the scattering matrix is, with regards to its physical meaning, the ratio between the wave b reflected by the port k and the wave a incident on port h, assuming that no other incident wave is applied. All the ports, excluding h, may be terminated by a resistance at or at least close to $R_0$ in order to determine the respective scattering parameters of port h.

Definition of scattering parameter $s_{kh}$ $$b_k = \sum_{h=1}^{N} s_{kh} a_h, (h, k = 1, \ldots N) \quad \text{(eq. 9)}$$

$$\Downarrow$$

$$s_{kh} = \left.\frac{b_k}{a_h}\right|, (a_m = 0, \forall m \neq h)$$

The parameters' physical meaning described allows the measurement of a linear N-port network, 2-ports at a time. Apply a stimulus on the port h, and measure the result on the port k. The ratio between those two quantities is the parameter of row index k and column index h. The difficulty of practically realizing that in the [Z]-case lies on the type of stimulus to apply. A current generator is needed, which is almost impossible to realize at RF frequencies. On the other side, the stimulus needed to measure the S-parameters is an incident wave generator, which means a generator with a finite output resistance equal or close to $R_0$. Such generator, also known as matched generator, is much easier to realize at RF than the current generator. Thus, it follows that measuring the S-parameters is advantageous to measuring [Z] at high frequency. Furthermore, it follows that the minimum setup to measure a linear N-port network consists of one generator matched to $R_0$, one receiver with input impedance also equal to $R_0$, N−2 resistors with impedance Z=approx. $R_0$, needed to terminate the N−2 other ports.

Thus, a conventional measurement technique first involves a matched generator (MG) which is a voltage generator with an output resistance equal or close to $R_0$ and with known power, a matched receiver (MR) which is a voltage meter with an input resistance also equal or close to $R_0$, wherein the measured voltage equals to the reflected wave, and N−2 resistors having a termination resistance at or close to $R_0$ and which are connected between the remaining ports and ground to ensure the absence of incident waves at those ports. The MG additionally includes one receiver and one bridge or one directional coupler, to measure the wave reflected by the port stimulated by the MG.

Thus, a conventional method to measure S-parameters is to connect the MG to port 1 and the MR to port 2, so that the parameters $s_{11}$ and $s_{21}$ are measured while having the other ports terminated with a termination resistance at or close to $R_0$. More in general, it comprises connecting the MG to port h and connecting the MR to port k. Then the parameters $s_{hk}$ and $s_{hh}$ are measured. Then the measurement may continue with the next couple of two ports. Thus two of the N×N S-parameters are measured at each measurement. The reflection parameter of each port is re-measured each time that port is excited. This means that (N−1)·(N−2) . . . =(N−1)! measurement steps may be used to complete the whole N×N S-parameters measurement. This brings the problem that many connections and disconnections may be used, although they can be automated by means of switching circuitry as known from multi-port network analyzers. At each measurement step, all the ports of the device to be tested (device under test, DUT) may be connected to something: the MG, or the MR, or the terminations. Thus, the conventional-technology method needs to simultaneously access all the N ports of the network to test. Sometimes the DUT is so small and the ports are so many and so close, that it is very difficult or simply not possible to access all of them simultaneously. Thus, there is a demand for an improved apparatus, an improved computer program, and an improved method for calculating one or more scattering parameters of a N-port linear network.

SUMMARY

The reference signs in the claims and in the detailed description of embodiments of the invention were added merely to improve readability. They are in no way meant to be limiting.

An embodiment may have an apparatus for calculating one or more scattering parameters of a linear network, the network including a number of N ports adapted to provide electric connections, wherein the apparatus is configured to calculate one or more scattering parameters of the linear network, which are related to a reference impedance $R_0$, on the basis of a measured electrical response at one or more ports of the linear network to an incident wave applied at a port of the linear network, measured under the condition that one or more of other ports of the linear network face a reflection coefficient $\Gamma$ with an amplitude $\rho$ of 0.5 or larger.

According to another embodiment, a method for calculating one or more scattering parameters of a linear network, the network including a number of N ports adapted to provide electric connections may have the steps of: calculating one or more scattering parameters of the linear network, which are related to a reference impedance, on the basis of a measured electrical response at one or more ports of the linear network to an incident wave applied at a port of the linear network, measured under the condition that one or more of other ports of the linear network face a reflection coefficient $\Gamma$ with an amplitude $\rho$ of 0.5 or larger.

According to another embodiment, a non-transitory digital storage medium may have a computer program stored thereon to perform the method for calculating one or more scattering parameters of a linear network, the network including a number of N ports adapted to provide electric connections, which method may have the steps of: calculating one or more scattering parameters of the linear network, which are related to a reference impedance, on the basis of a measured electrical response at one or more ports of the linear network to an incident wave applied at a port of the linear network, measured under the condition that one or more of other ports of the linear network face a reflection coefficient $\Gamma$ with an amplitude $\rho$ of 0.5 or larger, wherein said computer program is run by a computer.

The invention provides an apparatus for calculating one or more scattering parameters of a linear network, the network comprising a number of N ports adapted to provide electric connections, wherein the apparatus is configured to calculate one or more scattering parameters of the linear network, which are related to a reference impedance $R_0$, on the basis of a measured electrical response at one or more ports of the linear network to an incident wave applied at a port of the linear network, measured under the condition that one or more of other ports of the linear network face a reflection coefficient $\Gamma$ with an amplitude $\rho$ of 0.5 or larger, a method for calculating one or more scattering parameters of a linear network, the network comprising a number of N ports adapted to provide electric connections, the method comprising calculating one or more scattering parameters of the linear network, which are related to a reference impedance, on the basis of a measured electrical response at one or more ports of the linear network to an incident wave applied at a port of the linear network, measured under the condition that one or more of other ports of the linear network face a reflection coefficient $\Gamma$ with an amplitude $\rho$ of 0.5 or larger, and a computer program for performing the aforementioned method, wherein the computer program runs on a computer.

A port being designated "other port" in the sense of this invention is advantageously a port of the linear network that is neither used for applying an incident wave for a respective measurement nor used for measuring an electrical response during the respective measurement. Thus, it becomes clear, that the status of being an "other port" depends on if that port is in use during a measurement or not.

$\rho$ in the sense of the invention is defined as the amplitude of a reflection coefficient $\Gamma$ of a port of the linear network, thus $\rho=|\Gamma|$. $\Gamma$ in the sense of the invention is provided by the formula $\Gamma=(Z-R_0)/(Z+R_0)$, wherein $Z$ is an actual complex impedance present at one or more other ports and $R_0$ being the reference impedance, for example, of the linear network. The complex impedance $Z$ of a passive element, for example a termination resistance, is described by the equation $Z=R+j\cdot X$ and $[j=(-1)^{0.5}]$. It follows accordingly that the amplitude $\rho$ of the complex number $\Gamma$ is never larger than 1 for a passive element.

The invention allows to calculate one or more scattering parameters of the linear network, even if during the measurement of an electrical response one or more of other ports of the linear network face a reflection coefficient $\Gamma$ with an amplitude $\rho$ of 0.5 or larger. This corresponds to a value of impedance $Z$ smaller than or equal $\frac{1}{3}\cdot R_0$ or to a value of $Z$ larger than or equal $3\cdot R_0$, or infinite other combinations of $R$ and $X$, present at one or more of the other ports of the linear network. Advantageously, $\rho$ is larger than 0.6 or larger than 0.7. It is even more advantageous that p is larger than 0.8. Most advantageously, $\rho$ is larger than 0.9. Thus, according to the invention, it becomes unnecessary to terminate some or all of the other ports not in use during a measurement with a terminating impedance relatively close to $R_0$.

A termination impedance relatively close to $R_0$, as present at the other ports in the conventional technology, by definition means having a reflection coefficient $\Gamma$ with an amplitude $\rho$ of $\frac{1}{3}$ or smaller. This corresponds to having an impedance $Z$ at each of the other ports not smaller than $0.5\cdot R_0$ and not larger than $2\cdot R_0$, or infinite other combinations of $R$ and $X$.

Therefore, the apparatus, the method, and the computer program described herein each provide improved solutions as the calculation of the S-parameters of a linear network is possible, even if the actual impedance at one or more of the other ports may correspond to having a relatively large deviation from $R_0$ in comparison to conventional technology. Consequently, in an advantageous embodiment of the invention, the invention allows to calculate the S-parameters of the linear network while only needing access to two ports at a time during the measurements.

It is advantageous that the apparatus is configured to calculate the one or more scattering parameters on the basis of the electrical response measured under the condition that one or more of the other ports of the linear network are open-circuited so that one or more of the other ports face a reflection coefficient $\Gamma$ with an amplitude $\rho$ of 0.5 or larger. Having one or more of the other ports open-circuited means that, during the measurement, the DUT ports being connected neither to an incident wave generator nor to an electrical response receiver are kept open. Thus, the impedance $Z$ is much larger than $3\cdot R_0$ at any open-circuited port. $\rho$ for each of the ports being open-circuited during a measurement is actually larger than 0.5 and typically close to 1 as $\Gamma$ at each open-circuited port in this embodiment equals or at least approximates +1. Therefore, this embodiment may have the advantage that it may become unnecessary to terminate one or more of the "other ports" of the linear network which are not in use during the measurement with a resistance $R_0$ or relatively close to $R_0$ while calculating the scattering parameters still remains possible. Thus, measuring S-parameters may become more comfortable, advantageously regarding linear networks in which the ports are very close to each other or are otherwise difficult to terminate with a suitable resistor. This advantageous embodiment needs to access only two ports at a time, the port for the incident wave generator and the port for the electrical response receiver. Thus, in an advantageous embodiment, one or more measurements of the electrical response were performed under the condition that all of the other ports are kept open-circuited.

In an alternative embodiment, the apparatus is configured to calculate the one or more scattering parameters on the basis of the electrical response measured under the condition that one or more of the other ports of the linear network are short-circuited. $\Gamma$ in this case equals approx. $-1$, advantageously exactly $-1$, as $Z$ in the case of a short-circuit is much smaller than $(\frac{1}{3})\cdot R_0$ at each short-circuited port. Thus $\rho$ is larger than 0.5. Again, it becomes unnecessary to terminate one or more of the other ports within a narrow corridor of $Z$ close to $R_0$ as the apparatus is still adapted to calculate the S-parameters of the linear network. Short-circuiting one or more ports may be an advantageous solution wherever keeping one or more of the other ports open-circuited is not a suitable option. It may as well provide a more convenient way of handling the other ports in comparison to conventional technology, as conventional technology may use a proper termination of each of the other ports with an impedance corresponding relatively close to $R_0$. In some embodiments of the invention, one or more of the other ports are kept short-circuited during a measurement of the electrical response and/or one or more of the other ports are kept open-circuited during a measurement of the electrical response.

In an advantageous embodiment, the apparatus is configured to keep one or more of the other ports of the linear network open-circuited when measuring an electrical response to an incident wave at one or more ports of the linear network. If the calculating apparatus has the ability to keep one or more of the number of N ports of the linear network open-circuited, the measurement process may be at least partially automated. The user will not need to ensure that one or more of the number of N ports are open-circuited in order to provide a sufficiently large $\rho$, as the apparatus may do so automatically. Thus, the measurement process may become more comfortable and/or less demanding for the user. In the alternative, the apparatus may be configured to keep one or more of the number of N ports of the linear network short-circuited while measuring an electrical response to an incident wave at a port of the linear network.

It is advantageous that the apparatus is configured to measure the electrical response at one or more ports which comprises connecting a matched receiver to a port. This feature allows to integrate measuring capabilities into the apparatus configured to calculate the S-parameters. This may lead to a higher integration of functions into the apparatus which can lead to a more convenient process of calculating S-parameters of a linear network. In alternative embodiments, the apparatus is not configured to measure the electrical response at a port. Thus, a user has to measure the electrical response with a different apparatus and has to feed the measurement results to the present apparatus for calculating the S-parameters. This can be advantageous if, for example, the measurements shall be performed in the field and the calculations shall be performed on an apparatus at a distant location, advantageously on a central computer. It should be noted that a matched receiver, which is an advantageous receiver for the electrical response, may have a certain tolerance with regards to $R_0$, for example a tolerance of up to 20%, advantageously up to 10%, more advantageously up to 5%, without falling out of the definition of a matched receiver.

In an advantageous embodiment, the apparatus is configured to generate the incident wave which comprises connecting a matched generator to a port. A matched generator in the sense of the invention is an incident wave generator and is not necessarily exactly matched to the reference impedance. It may have, as well as the matched receiver, tolerances of up to 20%, advantageously up to 10%, advantageously up to 5%, with respect to the value $R_0$ of the reference impedance. If the apparatus is configured to generate the incident wave, the apparatus exhibits an additional function which allows the user to experience an improved handling with respect to generating the incident wave. It is even more advantageous that the matched generator comprises a matched receiver in order to measure an electrical response at the stimulated port. Thus, advantageously, a measurement apparatus comprises a matched generator for stimulating a first port of the linear network, advantageously by generating a wave $a_{first}$, the matched generator comprising a first matched receiver for measuring an electric response at the first port, advantageously an electric response wave $b_{first}$, and a second matched receiver for measuring an electric response at a second port, advantageously an electric response wave $b_{second}$. It is advantageous to designate $a_{first}$ as $a_h$, in line with the mathematical descriptions given in the conventional-technology section. It is advantageous to designate $b_{first}$ as $b_h$, in line with the mathematical descriptions given in the conventional-technology section. It is advantageous to designate $b_{second}$ as $b_k$, in line with the mathematical descriptions given in the conventional-technology section. Advantageously, the first port is designated as port h in line with the mathematical equations given above. It is furthermore advantageous to describe the second port as port k in line with the mathematical equations given above.

It is advantageous that the apparatus is configured to generate the incident wave in order to stimulate a first port of the network, and configured to measure the electrical response at the first port and/or at a second port of the network and configured to use the result of the measurement of the electrical responses at the first port and/or at the second port in one or more subsequent calculations in order to calculate one or more scattering parameters of the linear network related to the reference impedance. An apparatus configured in this way can perform generation, measurement and calculation sequentially and thus allows for a very convenient calculation process.

Advantageously, the apparatus is configured to use the result of a measurement of electrical responses at the first port and at the second port in a calculation to calculate a scattering parameter for a 2-port network formed by the first port and the second port in order to subsequently calculate one or more scattering parameters of the linear network. Calculating scattering parameters for a 2-port network is a very common task, as laid out in the conventional-technology section above. If it can be automatized and thus be performed by the apparatus, the process of calculating one or more scattering parameters of the linear network may become more convenient for the user. It is advantageous that the apparatus is adapted to use electrical responses at the first port, advantageously called port h, and electrical responses at the second port, advantageously called port k, to determine S-parameters $s'_{hk}$, $S'_{hh}$, $S'_{kh}$ and $s'_{kk}$ of the 2-port network formed by the first port and the second port. Those scattering parameters of the 2-port network do not coincide with the $s_{hk}$, $s_{hh}$, $s_{kh}$ and $s_{kk}$ of the linear network, the DUT, any longer. Rather, $s'_{hk}$, $s'_{hh}$, $s'_{kh}$ and $s'_{kk}$ are scattering parameters of the 2-port network formed by the first port and the second port, which were advantageously obtained by measuring under the condition that the other N−2 ports of the linear network are kept open-circuited. It is advantageous that the apparatus is configured to calculate one or more of the Z'-parameters of one or more 2-port networks formed by the first port and the second port using eq. 9 from the conventional-technology section.

It is furthermore advantageous that the apparatus is configured to use one or more of the scattering parameters of the 2-port network formed by the first port and the second port in the calculation in order to calculate one or more impedance parameters of the 2-port network formed by the first port and by the second port in order to subsequently calculate one or more scattering parameters of the linear electronic network. Calculating one or more impedance parameters can be useful or advantageous in a process of a subsequently calculating one or more scattering parameters of the linear electronic network if the measurement was performed under the condition that a reflection coefficient with an amplitude ρ at 0.5 or larger is present at one or more of the other ports of the linear network. As this can be a repetitive and time-consuming task, depending on the number of scattering parameters to transform into impedance parameters, it is useful to configure an apparatus accordingly. Advantageously, the apparatus is configured to calculate impedance parameters $z'_{hk}$, $z'_{hh}$, $z'_{kh}$ and $Z'_{kk}$ of the 2-port network from the corresponding $s'_{hk}$, $S'_{hh}$, $S'_{kh}$ and $s'_{kk}$ of the 2-port network via eq. 5 given in the conventional-technology section, adapting the formula for N=2.

In an advantageous embodiment, the apparatus is configured to use one or more of the impedance parameters of the 2-port network formed by the first port and the second port to calculate one or more scattering parameters of the linear network. This embodiment allows to use of the impedance parameters in a calculation to find one or more scattering parameters of the linear network. As the number of impedance parameters may be large and since such calculations may consume a significant amount of time if performed by a human, it can be advantageous to configure the apparatus to use the impedance parameters in such a calculation.

Advantageously, the apparatus is configured to calculate one or more scattering parameters of the linear network from an impedance matrix comprising one or more of the impedance parameters of the 2-port network formed by the first port and the second port. It is advantageous that the apparatus is configured to create an impedance matrix of the linear network from the impedance parameters of two or more 2-port networks. It is furthermore advantageous that the apparatus is configured to create a N×N impedance matrix wherein $z'_{hk}$, $z'_{hh}$, $z'_{kh}$ and $z'_{kk}$ of the first port, advantageously port h, and the second port, advantageously port k, are situated at row h and column k of said matrix respectively. By using a matrix transformation it becomes possible to calculate one or more scattering parameters of the linear network from the impedance matrix comprising one or more of the impedance parameters of the 2-port network formed by the first port and the second port.

In an advantageous embodiment the apparatus is configured to perform sequential measurements of electrical responses of two or more 2-port networks among the N ports of the linear network in order to calculate scattering parameters of each 2-port network under the condition of keeping the other N–2 ports of the linear network open-circuited during each measurement. Furthermore, it is advantageous that the apparatus is configured to calculate the impedance parameters of the two or more 2-port networks from the calculated scattering parameters of each of the 2-port networks. It is even more advantageous that the apparatus is configured to create an N×N impedance matrix of the linear network on the basis of impedance parameters of two or more of the 2-port networks. The advantageous embodiment of the apparatus, especially if all three of the features mentioned above in this paragraph are present, may allow to advantageously calculate S-parameters of the linear network from measurements of electrical responses which were performed under the condition of keeping some or more ports of the linear network open-circuited during each measurement. In other words, advantageously the measurement steps are repeated for all (N−1)!/2 of possible couples of ports of the linear network in order to obtain the complete N×N Z-matrix of the linear network itself.

It is advantageous that the apparatus is configured to mathematically transform an impedance matrix, created from impedance parameters of 2-port networks, into an S-matrix, the S-matrix comprising the electronic scattering parameters of the linear network. It is well-known how to transform an impedance matrix, known also as Z-matrix or [Z], into a scattering matrix, known also as S-matrix or [S], as described in the conventional-technology section. As by definition the Z'-parameters of the 2-port networks coincide with Z-parameters of the Z-matrix of the linear network, a convenient way of obtaining S-parameters of the linear network can be selected. Thus, advantageously, all the $z'_{hk}$, $z'_{hh}$, $z'_{kh}$ and $z'_{kk}$ of all possible 2-port combinations are calculated from the measured $s'_{hk}$, $s'_{hh}$, $s'_{kh}$ and $s'_{kk}$ in order to fill a N×N matrix having all of the $z'_{hk}$, $z'_{hh}$, $z'_{kh}$ and $z'_{kk}$ at their respective positions at row h and column k of the N×N matrix, respectively. This matrix, thus, coincides with the Z-matrix of the linear network. Thus, advantageously by applying the known transformation between the Z-matrix, comprising Z'-parameters of 2-port networks, and an S-matrix, the S-matrix of the linear network may be calculated using eq. 6 even if the measurement of an electrical response was performed under the condition that one or more of the other ports of the linear network face a reflection coefficient Γ with an amplitude ρ of 0.5 or larger.

It is advantageous that the apparatus is configured to de-embed a residual interference from the S-matrix calculated for the linear network. For example, open-circuited ports of the DUT may present relevant residual impedance, such as in the one due to a fringe effect capacitance. Sometimes such impedance is also present when the DUT is connected to its surrounding elements. In that case, the residual reactance may be considered part of the DUT and no additional action is required. If the residual impedance is known, and it is also known that this difference between measurement and usage condition, then it should not be considered as part of the DUT, and it may need to be de-embedded. This is possible by means of a simple procedure based on the admittance matrix, also known as Y-matrix, which is the inverse of the impedance matrix (see eq. 10).

Admittance matrix $[Y]$, $[Y] = [Z]^{-1}$ $$\begin{bmatrix} I_1 \\ I_2 \\ \vdots \\ I_N \end{bmatrix} = \begin{bmatrix} y_{11} & y_{12} & \cdots & y_{1N} \\ y_{21} & y_{22} & \cdots & y_{2N} \\ \cdots & \cdots & \ddots & \vdots \\ y_{N1} & y_{N2} & \cdots & y_{NN} \end{bmatrix} \cdot \begin{bmatrix} V_1 \\ V_2 \\ \vdots \\ V_N \end{bmatrix} \quad \text{(eq. 10)}$$

It is advantageous that the apparatus is configured to calculate the admittance matrix of the linear network and to calculate the S-matrix of the linear network using the inverse of the admittance matrix. Given the known residual impedance at the DUT port k ($Z_{Pk}$) with k=1, 2, . . . , N), the N impedances to ground are themselves an N-port network with admittance matrix $[Y_{RESIDUAL}]$, as shown by eq. 11. Such N-port network is parallel-parallel connected to the N-port network given by the DUT. The resulting embedded Y-matrix is the sum of the two corresponding matrices (eq. 12). Therefore the Y-matrix of the DUT, $[Y_{DUT}]$ can be easily extracted by subtracting $[Y_{RESIDUAL}]$ from $[Y_{MEASURED}]$ (eq. 13). The computation of the impedance matrix of the DUT, $[Z_{DUT}]$ reduces to the matrix inversion of $[Y_{DUT}]$ (eq. 14), obtained at the previous step. Then the scattering matrix of the DUT can be obtained easily, as shown with eq 15. In an advantageous embodiment, the apparatus is configured to perform all of the calculations described above and depicted in the equations 11 to 15.

Admittance matrix of the N impedances to ground $$[Y_{RESIDUAL}] = \begin{bmatrix} \frac{1}{z_{P1}} & 0 & \cdots & 0 \\ 0 & \frac{1}{z_{P2}} & \cdots & 0 \\ \cdots & \cdots & \ddots & \vdots \\ 0 & 0 & \cdots & \frac{1}{z_{PN}} \end{bmatrix} \quad \text{(eq. 11)}$$

$$[Y_{MEASURED}] = [Y_{DUT}] + [Y_{RESIDUAL}] \quad \text{(eq. 12)}$$

The measured admittance matrix comprises the admittance matrix of the DUT and the admittance matrix of the residual impedances $$[Y_{DUT}] = [Y_{MEASURED}] - [Y_{RESIDUAL}] \quad \text{(eq. 13)}$$

The actual admittance matrix of the DUT follows from subtracting the admittance matrix of the residual impedances from the admittance matrix of the measured admittance.

$$[Z_{DUT}] = [Y_{DUT}]^{-1} \quad \text{(eq. 14)}$$

The impedance matrix of the DUT is the inverse of its admittance matrix.

$$[S_{DUT}] = \{[Z_{DUT}] - [E]R_0 Z_{DUT}] + [Z_{DUT}]R_0\}^{-1} \quad \text{(eq. 15)}$$

The scattering matrix, [S], of the DUT in this embodiment is calculated by using the inverse of the admittance matrix, [Z].

Advantageously, the number of ports of the linear network is three or more. Calculating the S-parameters of a linear network having three or more ports can be very time-consuming and difficult. Especially if the DUT has a linear network with ports very close to each other and a high number of ports measuring the electric response at each port can be a difficult task. Thus, if the apparatus is adapted to calculate scattering parameters of a network comprising more than three ports, such an apparatus can be of significant technical use. For example, the number of ports is five or more, or even more than 10. In some embodiments, the number of ports is more than twenty.

It is advantageous that the apparatus is an S-parameter determination apparatus/device. Such apparatuses are known, for example, from the chip industry, and there is a large demand for improving time-consuming and difficult determinations of S-parameters.

It is advantageous that the apparatus is a chip tester. Especially in the chip industry DUTs having a large number of ports are known. In general, electronic chips are small in size. In addition the number of ports on a given surface of the chip is often very large. Thus, there may be only a small distance between two ports so that it can become extremely difficult to terminate all other ports with a resistance corresponding to $R_0$ with a $\rho$ equal to or smaller than 0.3, the other ports not being used for generating an incident wave or measuring an electrical response during a measurement. The present invention thus allows to provide a chip tester that can calculate one or more S-parameters of advantageously a semiconductor microchip, representing an advantageous type of a linear network, even if during the measurement of an electrical response one or more of the other ports of the semiconductor microchip face a reflection coefficient with an amplitude $\rho$ of 0.5 or larger.

BRIEF DESCRIPTION OF THE DRAWINGS

Embodiments of the present invention will be detailed subsequently referring to the appended drawings, in which.

DETAILED DESCRIPTION OF THE INVENTION

The invention is described in detail with regards to FIG. 1 to FIG. 8B. The invention is in no way meant to be limited to the shown and described embodiment.

Figure 1:
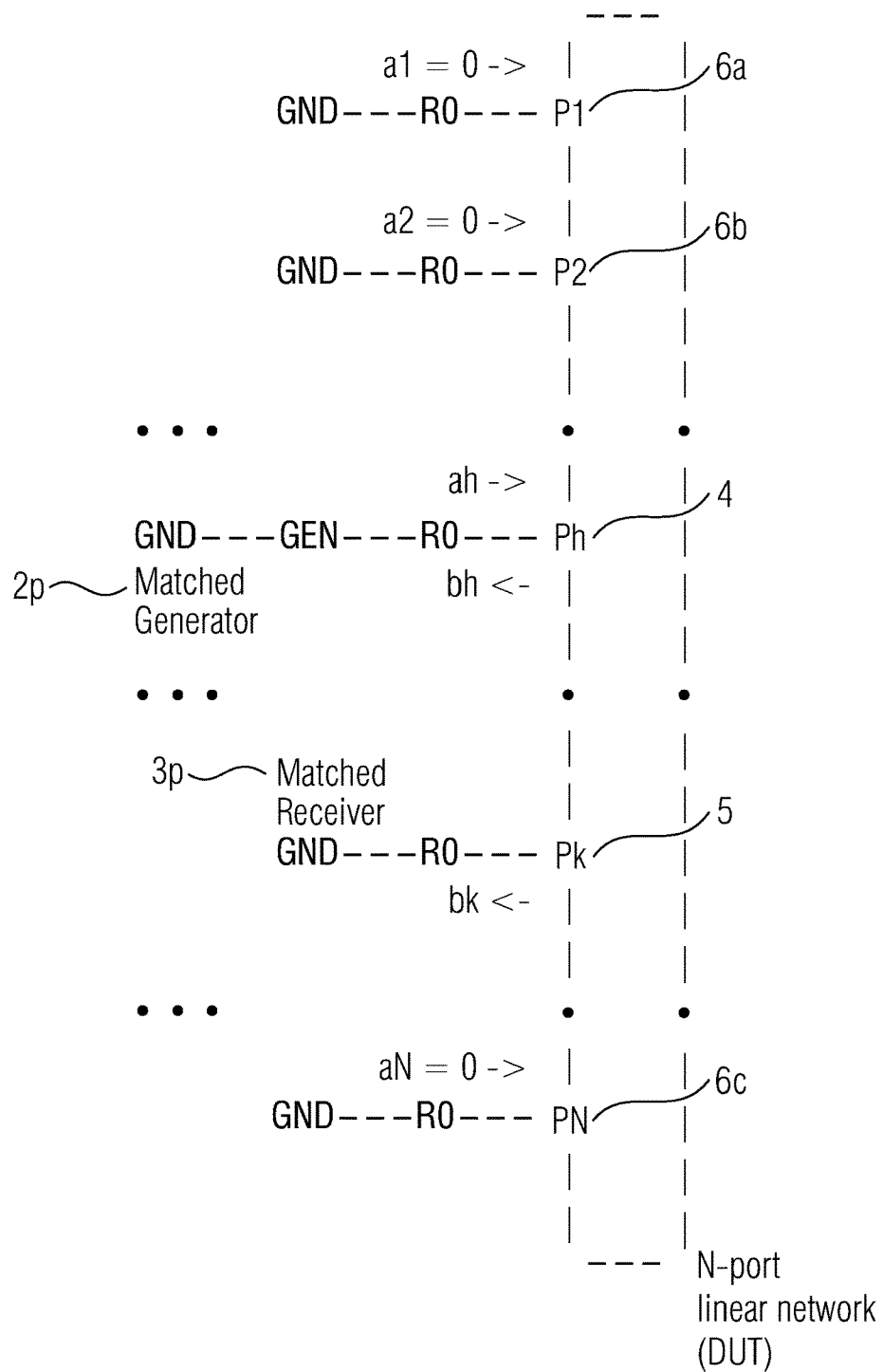
FIG. 1 shows a first N-port linear network connected to a conventional setup in order to perform a conventional calculation of S-parameters.

FIG. 1 shows a first N-port linear network 1 connected to a conventional setup in order to perform a conventional calculation of S-parameters. An apparatus (not shown) is configured to calculate one or more scattering parameters of the N-port linear network 1, the N-port linear network 1 comprising a number of N ports adapted to provide electric connections. The conventional setup comprises a matched generator 2p for generating an incident wave, the matched generator 2p comprising a first matched receiver (not shown) for measuring an electrical response and a bridge (not shown). In other embodiments, the bridge may be replaced by a directional coupler. The conventional setup furthermore comprises a second matched receiver 3p being separate from the matched generator 2p that comprises the first matched receiver. The matched generator 2p is a voltage generator with an output resistance $R_0$ and with known power. The first match receiver and the second matched receiver 3p are voltage meters with an input resistance also equal to $R_0$. The measured voltage corresponds to the reflected wave respectively, as described in the conventional-technology section. The matched generator 2p and the first matched receiver are connected to a first port 4, port h (h=1, 2, 3, ... N), of the first N-port linear network 1. The second matched receiver 3p is connected to a second port 5, port k (k=1, 2, 3, ... N; k≠h), of the first N-port linear network 1. The N−2 other ports 6a, 6b, 6c of the first N-port linear network 1 each are terminated with passive termination resistors (not shown) providing an actual impedance Z corresponding ideally to the reference resistance $R_0$ and being connected between the other ports 6a, 6b, 6c and ground to ensure the absence of incident waves at those other ports 6a, 6b, 6c. Thus, at all of the N−2 other ports 6a, 6b, 6c $\rho$ is smaller than ⅓ as $\Gamma=(Z-R_0)/(Z+R_0)$ equals zero because Z at each other port 6a, 6b, 6c equals $R_0$. It is understood that the designation of the N ports 4, 5, 6a, 6b, 6c as first port 4, second port 5 and other ports 6a, 6b, 6c depends on to which two ports of the N ports 4, 5, 6a, 6b, 6c the matched generator 2p, which comprises the first matched receiver, and the second matched receiver 3p are connected to, respectively, in order to perform a measurement. These two ports 4, 5 are then designated first port 4 and second port 5, respectively, the N−2 remaining ports being designated as other ports 6a, 6b, 6c.

When the matched generator 2p generates an incident wave at the first port 4, port h, the incident wave, being designated as $a_h$, the first matched receiver and the second matched receiver 3p measure the electrical response at port h, the electrical response being designated as $b_h$, and the electrical response at the second port 5, port k, the electrical response being designated as $b_k$, respectively. Thus, the S-parameters $s_{kh}$ and $s_{hh}$ can be calculated by the conventional apparatus via eq. 9. After that, the matched generator 2p is connected to port k and the second matched receiver 3p is connected to port h in order to obtain the s-parameters $s_{hk}$ and $s_{kk}$. The described measurement and calculation is repeated for all possible combinations of 2-ports formed by first ports 4 and second ports 5 under the condition that the N−2 other ports 6a, 6b, 6c are terminated with a resistance corresponding to $R_0$ in order to obtain all N×N S-parameters of the N-port linear network 1, therefore, $\rho$ being smaller than ⅓ at any of the other ports 6a, 6b, 6c during each measurement. The reflection parameter of each first port 4 is re-measured each time that each first port 4 is excited. As the measurements involve reconnecting the matched generator 2p, the second matched receiver 3p and the N−2 resistors to different ports 4, 5, 6a, 6b, 6c repetitively, the measurement process may take a significant amount of time. Furthermore, it may be difficult or even impossible to terminate all of the N−2 other ports 6a, 6b, 6c, for example, if the first port 4, the second port 5, and the other ports 6a, 6b, 6c are situated closely to each other or if they are somehow obstructed.

The invention provides an apparatus 7, a method and a computer program each being configured to calculate one or more scattering parameters of the N-port linear network 1, 8, which are related to a reference impedance $R_0$, on the basis of a measured electrical response at a port 4, 5 of the linear network to an incident wave applied at a port 4 of the linear network, measured under the condition that one or more of other ports 6a, 6b, 6c of the N-port linear network 1 face a reflection coefficient with an amplitude ρ of 0.5 or larger. Thus, properly terminating the N−2 other ports 6a, 6b, 6c of the network 1 during a measurement at the first port 4 and/or the second port 5 in order to provide a reflection coefficient with an amplitude ρ smaller than or at ⅓ as known from conventional technology becomes unnecessary.

Figure 2A:
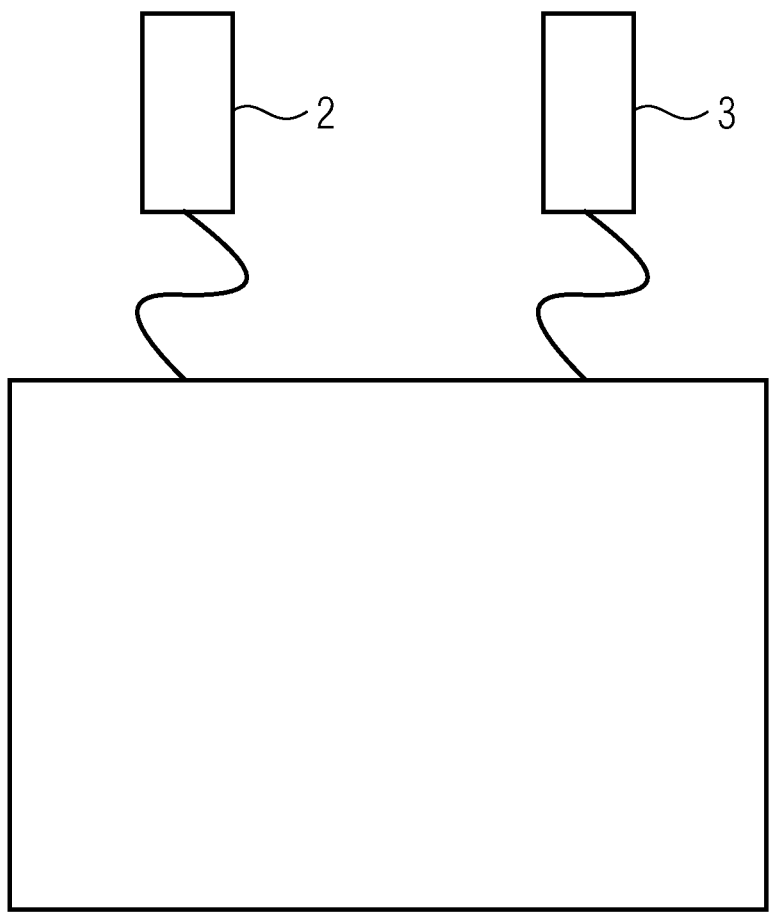
FIG. 2A shows a schematic drawing of an exemplary apparatus according to the invention.

FIG. 2A shows a schematic drawing of such an apparatus 7 according to the invention. The apparatus 7 is an S-parameter determination apparatus and comprises a matched generator 2 for generating an incident wave, the matched generator 2 comprising a first matched receiver (not shown) for measuring an electrical response. Thus, the matched generator 2 and the first matched receiver (not shown) share a connector. Additionally, the matched generator 2 comprises a bridge (not shown). The apparatus furthermore comprises a second matched receiver 3 being separate from the matched generator 2. The matched generator 2 is a voltage generator with an output resistance $R_0$ and with known power. The first matched receiver (not shown) and the second matched receiver 3 are voltage meters with an input resistance also equal to $R_0$. The apparatus 7, as described in view of FIG. 2A, is configured to keep one or more of the number of N "other ports" 6a, 6b, 6c of the linear network 1, the other ports 6a, 6b, 6c being not in use during a measurement, open-circuited under the condition of measuring an electrical response to an incident wave at a port 4, 5 of the linear network 1. The apparatus 7 comprises no additional terminations or contacts to terminate the other ports 6a, 6b, 6c of the N-port linear network 1. The apparatus 7 runs a computer program according to the invention in order to calculate S-parameters of the N-port linear network 1 by using the method according to the invention.

Figure 2B:
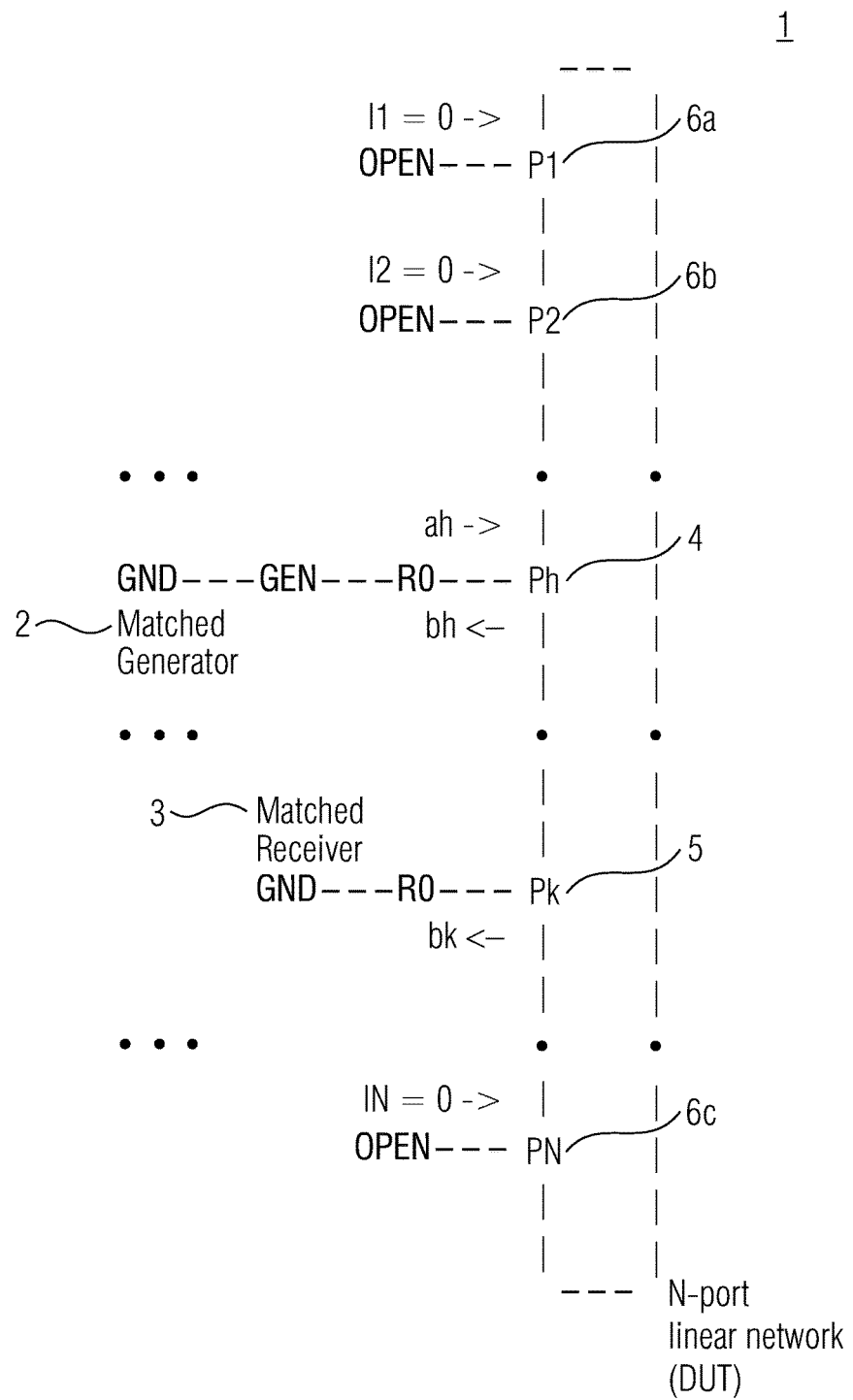
FIG. 2B shows a measurement setup with an exemplary apparatus according to the invention connected to the first N-port linear network which may be running an exemplary computer program according to the invention, which may be thus configured to use an exemplary method according to the invention.

FIG. 2B shows a technical application of the apparatus 7 according to the invention as depicted in FIG. 2A. The apparatus 7 in this embodiment is configured to operate as a chip tester. The apparatus 7 runs a computer program according to the invention in order to calculate S-parameters of a N-port linear network (N>3) of a semiconductor microchip. The apparatus 7 is configured to measure the electrical response at one or more ports 4, 5 which comprises connecting the matched receiver 3 to a port 4, 5. Furthermore the apparatus 7 is configured to generate the incident wave which comprises connecting the matched generator 2 to a port 4. For this reason, the apparatus 7 is adapted to connect the matched generator 2 comprising the first matched receiver to a first port 4, port h (h=1, 2, 3, . . . , N), of the N-port linear network 1. The apparatus 7 furthermore is adapted to connect the second matched receiver 3 to a second port 5, port k (k=1, 2, 3, . . . , N; k≠h), of the N-port linear network 1. While the technical features of the matched generator 2, the first matched receiver and the second matched receiver 3 are identical in comparison with the technical features described in view of FIG. 1 and while the N-port linear network 1 remains the same, the apparatus 7 according to the invention, as described in view of FIG. 2A, is configured to keep one or more of the number of N ports of the linear network 1, the other ports 6a, 6b, 6c, open-circuited under the condition of measuring an electrical response to an incident wave at a port 4, 5 of the linear network 1.

In this technical application of the invention, according to FIG. 2B, all N−2 other ports 6a, 6b, 6c are kept open-circuited during a measurement. Thus, the N−2 other ports 6a, 6b, 6c are neither stimulated by a wave generator ($I_N$=0), nor is an electrical response to an incident wave measured at that ports 6a, 6b, 6c, nor are they terminated with a resistor. Because of that, all of the N−2 other ports 6a, 6b, 6c face a reflection coefficient Γ of +1 in this embodiment and therefore ρ is larger than 0.5 as ρ equals the amplitude of Γ. That means that the apparatus 7 is configured to calculate the one or more scattering parameters on the basis of the electrical response measured and the condition that one or more of the other ports 6a, 6b, 6c of the N-port linear network 1, 8 are open-circuited so that one or more of the other ports 6a, 6b, 6c face a reflection coefficient Γ with an amplitude of ρ of 0.5 or larger. In contrast to that, conventional technology allows calculating one or more S-Parameters only as long as the actual complex impedance Z at each port is close to the reference impedance $R_0$, so that p equals or is smaller than ⅓. Thus, according to the present invention, the S-parameters of the N-port linear network 1 may be calculated despite the relatively large discrepancy between actual complex impedance Z present at one or more other ports 6a, 6b, 6c and $R_0$.

Figure 3:
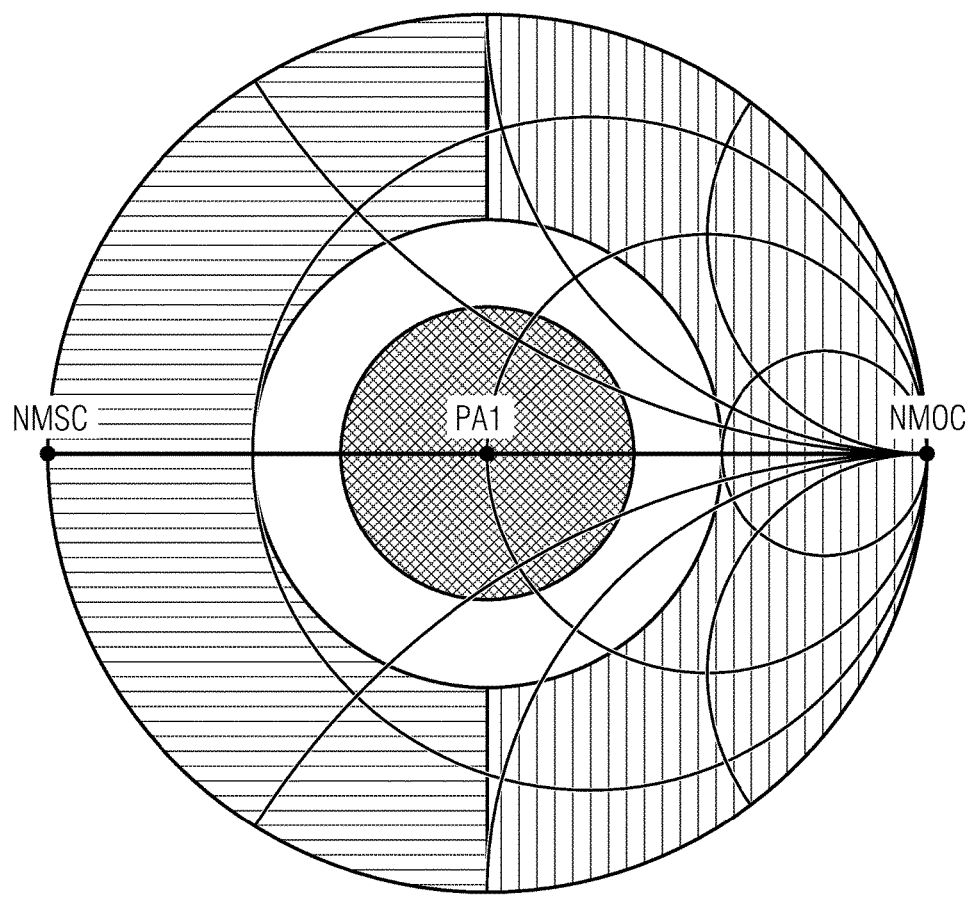
FIG. 3 shows a Smith chart illustrating acceptable values for $\Gamma$ and $\rho$ according to the invention.

Acceptable values for Γ and ρ according to the invention are illustrated in FIG. 3. FIG. 3 shows a Smith chart having a first section, labelled PA1, which refers to acceptable values for Γ according to conventional technology. According to the first section, Γ has a value of between −⅓ and +⅓, thus leading to a value for ρ between zero and +⅓. A second section, labelled NMOC at an upper extreme ending, includes the acceptable reflection coefficients Γ according to the invention, being 0.5 or larger. In a first ideal case, reflected by the upper extreme ending, Γ is +1, which means the N−2 other ports 6a, 6b, 6c are open-circuited during a measurement, as realized in the present embodiment of the invention. A third section, labelled NMSC at a lower extreme ending, includes the acceptable reflection coefficients Γ according to the invention being −0.5 or smaller. In a second ideal case, reflected by the lower extreme ending, Γ equals −1, which means the N−2 other ports 6a, 6b, 6c of the N-port linear network 1 are short-circuited during a measurement in that case, as realized in an embodiment of the invention which is not shown. Both, the second and the third section of the Smith chart, thus refer to acceptable values of ρ≥0.5. Having the other ports 6a, 6b, 6c either open-circuited or short-circuited will lead to a maximum value of ρ=1, ρ=|Γ|, for each port.

More in detail, according to the explanations given above, the apparatus 7 according to the embodiment as illustrated in FIG. 2A and shown in use in FIG. 2B is configured to generate the incident wave in order to stimulate a first port 4 of the N-port linear network, in this case port h, to measure the electrical response at the first port 4 and/or at a second port 5 of the N-port linear network 1, in this case port k, and to use the result of the measurement of one or more of the electrical responses at the first port 4 and/or at the second port 5 in one or more subsequent calculations in order to calculate one or more scattering parameters of the N-port linear network 1 related to the reference impedance. It is understood that, again, the designation of the N ports 4, 5, 6a, 6b, 6c as first port 4, second port 5 and other ports 6a, 6b, 6c depends on to which two ports of the N ports 4, 5, 6a, 6b, 6c the matched generator 2, which comprises the first matched receiver, and the second matched receiver 3 are connected to, respectively, in order to perform a measurement. These two ports 4, 5 are then designated first port 4 and second port 5 respectively, the N−2 remaining ports being designated as other ports 6a, 6b, 6c.

More specifically, the apparatus 7 according to the embodiment is configured to use the result of a measurement of electrical responses at the first port 4, port h, and at the second port 5, port k, in a calculation to calculate a scattering parameter for a 2-port network formed by the first port 4 and the second port 5 in order to subsequently calculate one or more scattering parameters of the N-port linear network 1 comprising the first port 4, the second port 5 and the other ports 6a, 6b, 6c. The embodiment is configured to use the voltage signals of the incident wave at port h, designated as $a_h$, the electrical responses at port h, designated $b_h$, and the electrical response at port k, designated $b_k$, to calculate two S-parameters of the 2-port network, the S-parameters being designated as $s'_{kh}$ and $s'_{hh}$, by using the formula from eq. 9. The S-parameters $s'_{hk}$ and $s'_{kk}$ may be obtained analogously after connecting the matched generator 2 to port k and after connecting the matched receiver 3 to port h and performing the measurement and calculation described above. Thus, for example, the S'-parameters of a 2-port network formed by a seventh port and a ninth port of the linear network 1 are designated $s'_{97}$, $s'_{77}$, $s'_{79}$ and $s'_{99}$ according to the present invention. In that exemplary case, h equals 7 and k equals 9.

Furthermore, the apparatus 7 according to the embodiment is configured to use one or more of the scattering parameters of the 2-port network formed by the first port 4 and the second port 5 in a calculation in order to calculate one or more impedance parameters of the 2-port network formed by the first port 4 and by the second port 5 in order to subsequently calculate one or more scattering parameters of the N-port linear network 1 comprising the first port 4, the second port 5 and the other ports 6a, 6b, 6c. It does so as it is configured to use the previously known formula from eq. 5 in order to transform the 2-port network S'-parameters to 2-port network Z'-parameters. To perform this calculation, the apparatus is configured to use the E-matrix adapted for N=2 (see eq. 7).

In addition, the apparatus 7 according to the embodiment is configured to use one or more of the impedance parameters of the 2-port network formed by the first port 4 and the second port 5 to calculate one or more scattering parameters of the N-port linear network 1 comprising the first port 4, the second port 5 and the other ports 6a, 6b, 6c. For example, in the given embodiment according to FIG. 2B, the $z'_{kh}$ impedance parameter of the 2-port network formed by the port h and the port k coincides by definition with the impedance parameter at row h and column k of a N×N Z-Matrix of the N-port linear network 1 comprising the first port 4, the second port 5 and the other ports 6a, 6b, 6c. To exploit this correlation, the apparatus 7 as depicted in FIG. 2A is configured to perform sequential measurements of electrical responses of two or more 2-port networks among the N ports 4, 5, 6a, 6b, 6c of the N-port linear network 1 to calculate scattering parameters of each 2-port linear network under the condition of keeping the other N−2 ports 6a, 6b, 6c of the N-port linear network 1 open-circuited during each measurement, to calculate the impedance parameters of the two or more 2-port networks from the calculated scattering parameters of each of the 2-port networks and to create a N×N impedance matrix of the N-port linear network 1 comprising the first port 4, the second port 5 and the other ports 6a, 6b, 6c on the basis of impedance parameters of two or more of the 2-port networks. The latter may be achieved easily as the apparatus 7 is configured to mathematically transform an impedance matrix created from impedance parameters of 2-port networks into an S-matrix comprising the scattering parameters of the N-port linear network 1 comprising the first port 4, the second port 5 and the other ports 6a, 6c, 6c by using eq. 6. Thus, the apparatus 7 is readily configured to calculate one or more scattering parameters of the N-port linear network comprising the first port 4, the second port 5 and the other ports 6a, 6b, 6c from an impedance matrix comprising one or more of the impedance parameters of the 2-port network formed by the first port 4 and the second port 5. By this, it becomes possible to determine the S-matrix of a N-port linear network 1 comprising the first port 4, the second port 5 and the other ports 6a, 6b, 6c, even under the condition that one or more of the other ports 6a, 6b, 6c of the linear network 1 face a reflection coefficient with an amplitude ρ of 0.5 or larger.

Additionally, the embodiment of the apparatus 7 discussed in view of FIGS. 2A and 2B is configured to de-embed a residual interference from the S-matrix calculated for the N-port linear network 1 comprising the first port 4, the second port 5 and the other ports 6a, 6b, 6c. Given a known residual impedance at the port k ($z_{Pk}$ with k=1, 2, . . . , N), the N residual impedances to ground form themselves a N-port network with admittance matrix [$Y_{RESIDUAL}$]. Such N-port network is parallel-parallel connected to the N-port network given by the linear network 1 (DUT) comprising the first port 4, the second port 5 and the other ports 6a, 6b, 6c. The resulting "embedded" Y-matrix is the sum of the admittance matrices of the DUT and of the network formed by the N impedances to ground. Therefore, via the formula [$Y_{DUT}$]=[$Y_{MEASURED}$]−[$Y_{RESIDUAL}$] the Y-matrix of the linear network 1 can be easily extracted. The computation of the impedance matrix of the linear network 1, [$Z_{DUT}$], reduces to the matrix inversion of [$Y_{DUT}$] obtained at the previous step. Finally, the equation [$S_{DUT}$]={[$Z_{DUT}$]−[E]$R_0$}{[$Z_{DUT}$]+[$Z_{DUT}$]$R_0$}$^{-1}$ returns the S-matrix of the N-port linear network 1 comprising the first port 4, the second port 5 and the other ports 6a, 6b, 6c. The embodiment of the apparatus 7 is configured to perform all the calculations described above. Thus, the apparatus 7 is configured to calculate the admittance matrix of the N-port linear network 1 comprising the first port 4, the second port 5 and the other ports 6a, 6b, 6c, to subtract admittances of residual impedances and to calculate the S-matrix of the linear network 1 using the inverse of the admittance matrix of the linear network 1 (DUT).

Figure 4:
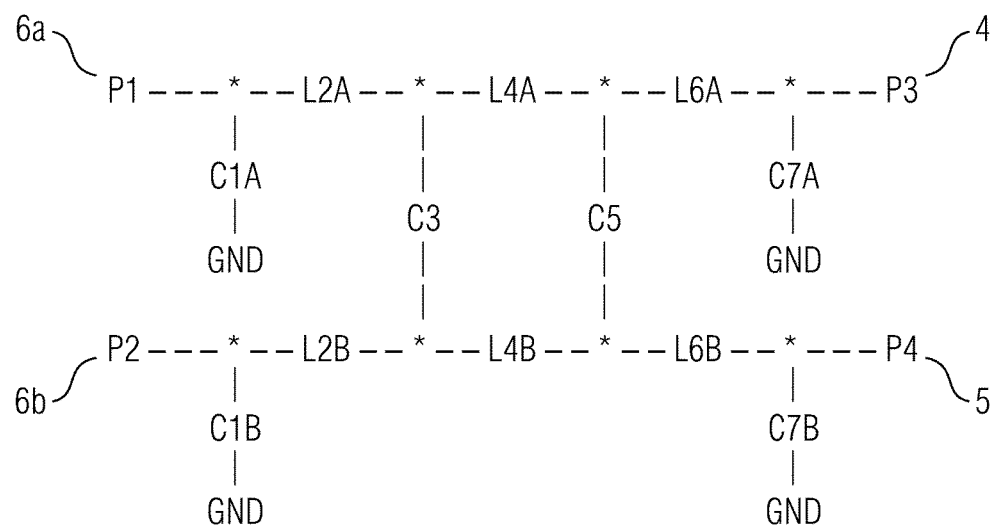
FIG. 4 shows a second N-port linear network which may be characterized with respect to its S-parameters by an exemplary apparatus according to the invention.
Figure 5:
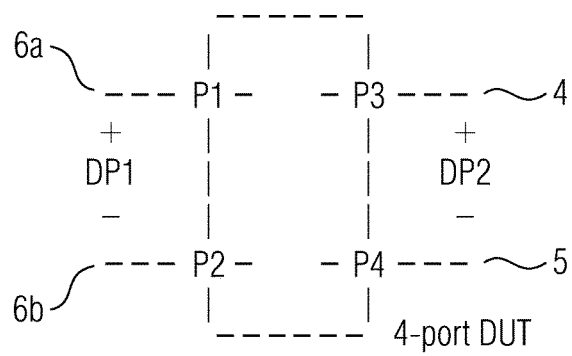
FIG. 5 shows a definition of a differential port with respect to the N-port linear network depicted in FIG. 4.

FIG. 4 shows a second N-port linear network 8 at which the embodiment of the invention is applied. The application proves the effectiveness of the invention by means of a 4-port linear network 8. More precisely, the second N-port linear network 8 (DUT) is a differential-input, differential-output filter. FIG. 5 depicts the definition of a differential port. In the considered case, a combination of 4-port S-parameters, [$S_D$] (see eq. 16), coming from the so-called single-ended to differential transformation shall be calculated. Thus, calculating the S-parameters may be performed in this case in order to calculate their combination [$S_D$].

Combination of S-parameters [$S_D$]

$$[S_D] = \frac{1}{2}\begin{bmatrix} s_{11}+s_{22}-s_{12}-s_{21} & s_{42}+s_{31}-s_{41}-s_{32} \\ s_{13}+s_{24}-s_{13}-s_{14} & s_{33}+s_{44}-s_{34}-s_{43} \end{bmatrix} \quad \text{(eq. 16)}$$

The DUT used for the effectiveness check has all its four ports 4, 5, 6a, 6b accessible. Therefore, it is possible to use both the conventional apparatus and the inventive apparatus 7, computer program and method. It is understood that the designation of the ports 4, 5, 6a, 6b as first port 4, second port 5 and other ports 6a, 6b again depends on which two ports of the four ports 4, 5, 6a, 6b the matched generator 2 comprising the first matched receiver and the second matched receiver 3 are connected to in order to perform a measurement. These two ports 4, 5 are then designated first port 4 and second port 5 respectively, the two remaining ports being designated as other ports 6a, 6b. The important parameters to measure are the differential reflection and transmission coefficients of each of the 2-port networks formed by the four ports 4, 5, 6a, 6b. Both said coefficients are electrical responses in the sense of the invention as described earlier.

Figure 6:
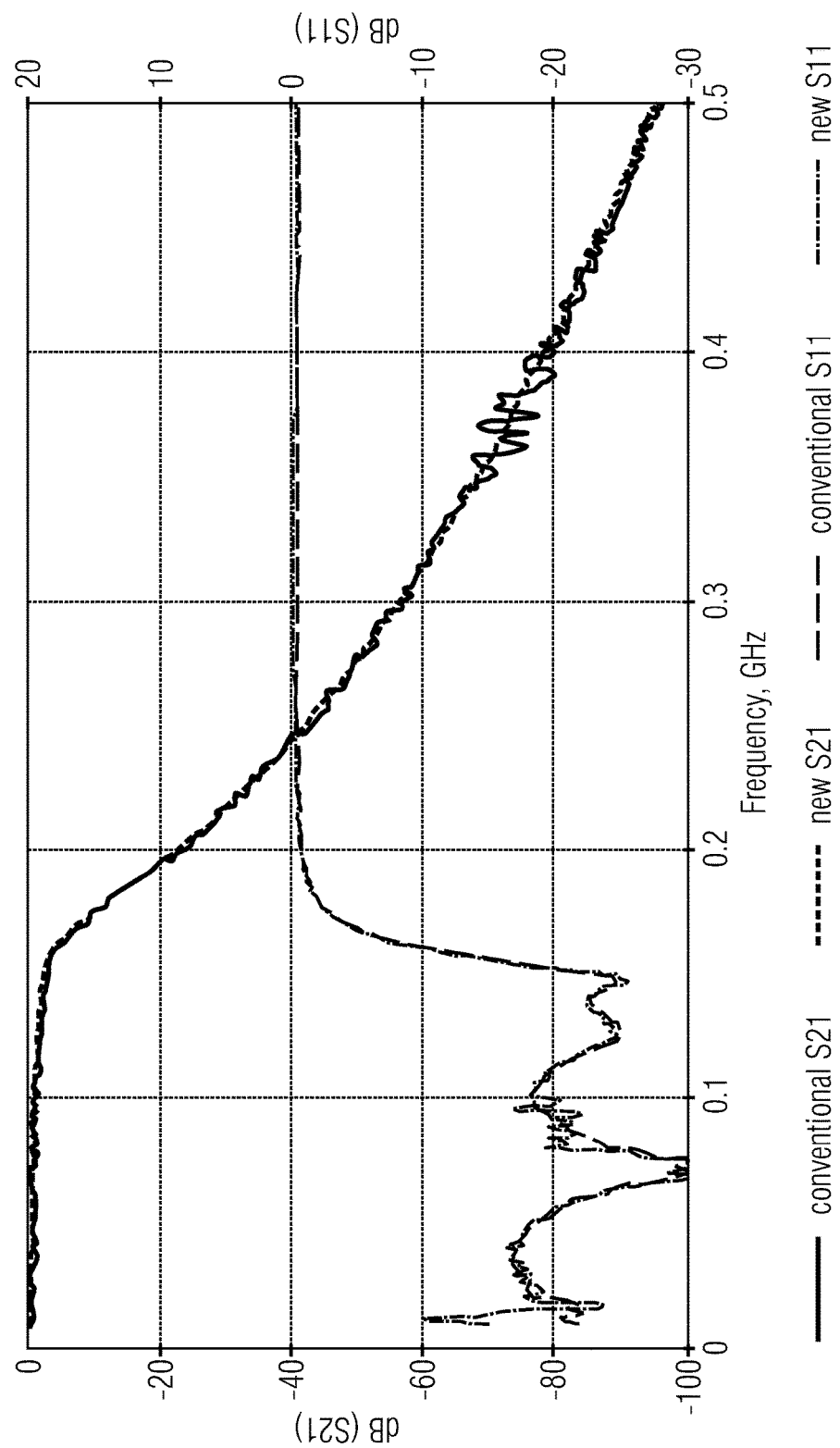
FIG. 6 shows a diagram which compares results obtained at the second N-port linear network via the inventive method to results obtained at the second N-port linear network via the conventional method.

FIG. 6 shows amplitudes in dB of the input reflection coefficient $S_{11}$ of the second linear network 8 depicted in FIG. 4. The output reflection coefficient is almost identical for this DUT. Furthermore FIG. 6 shows the amplitudes in dB of the forward transmission coefficient $S_{21}$ of the second linear network 8 depicted in FIG. 4. The reverse transmission coefficient is identical by definition, given the linear passive nature of the DUT. The apparatus 7 is configured to calculate the amplitude of the reflection coefficients $S_{11}$ and $S_{21}$ using eq. 17 and eq. 18 given below.

Amplitude of $s_{11}$ $$dB(S11) = 10 \cdot \log_{10}\left(\left|\frac{s_{11} + s_{22} - s_{12} - s_{21}}{2}\right|\right) \quad \text{(eq. 17)}$$

Amplitude of $s_{21}$ $$dB(S21) = 10 \cdot \log_{10}\left(\left|\frac{s_{13} + s_{24} - s_{13} - s_{14}}{2}\right|\right) \quad \text{(eq. 18)}$$

Figure 8A:
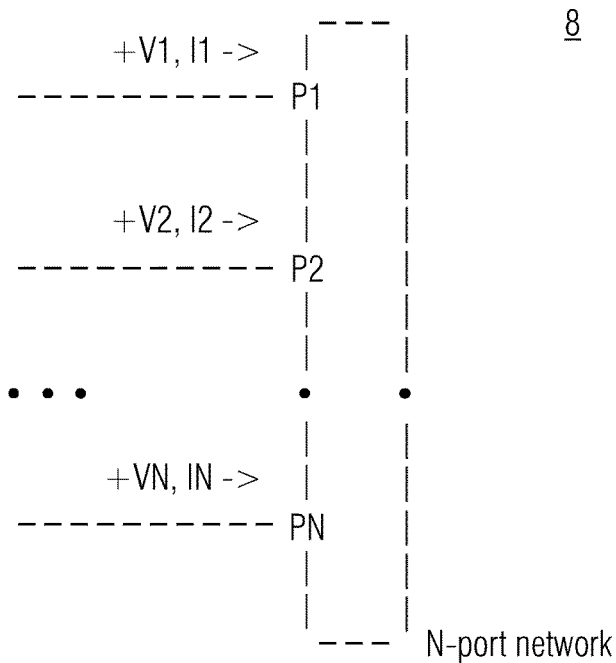
FIGS. 8A and 8B show two different examples of conventional N-port networks.
Figure 8B:
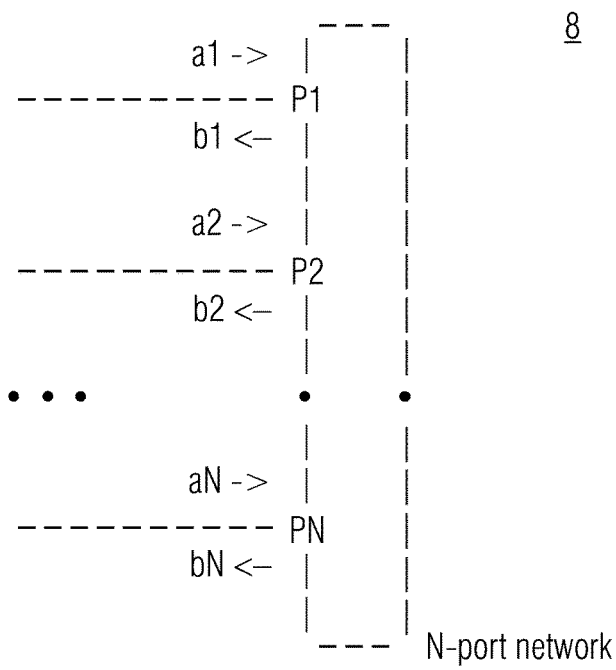

The conventional apparatus and the inventive apparatus 7, computer program and method come to almost identical results. Thus, the apparatus 7 configured to calculate one or more scattering parameters of the linear network 1, 8, which may be characterized via voltages V and currents I or with respect to incident waves a and electric responses b, as illustrated in FIG. 8A and FIG. 8B, respectively, the scattering parameters being related to a reference impedance $R_0$, on the basis of a measured electrical response at one or more ports 4, 5 of the linear network 1, 8 to an incident wave applied at a port 4 of the linear network, measured under the condition that one or more of other ports 6a, 6b of the linear network 1, 8 face a reflection coefficient Γ with an amplitude ρ of 0.5 or larger, comes to the same results as a conventional apparatus configured to calculate one or more scattering parameters of the linear network 1, 8, which are related to a reference impedance $R_0$, on the basis of a measured electrical response at one or more ports 4, 5 of the linear network 1, 8 to an incident wave applied at a port 4 of the linear network 8, measured under the condition that one or more of other ports 6a, 6b of the linear network 8 face a reflection coefficient Γ with an amplitude ρ of ⅓ or smaller.

Figure 7:
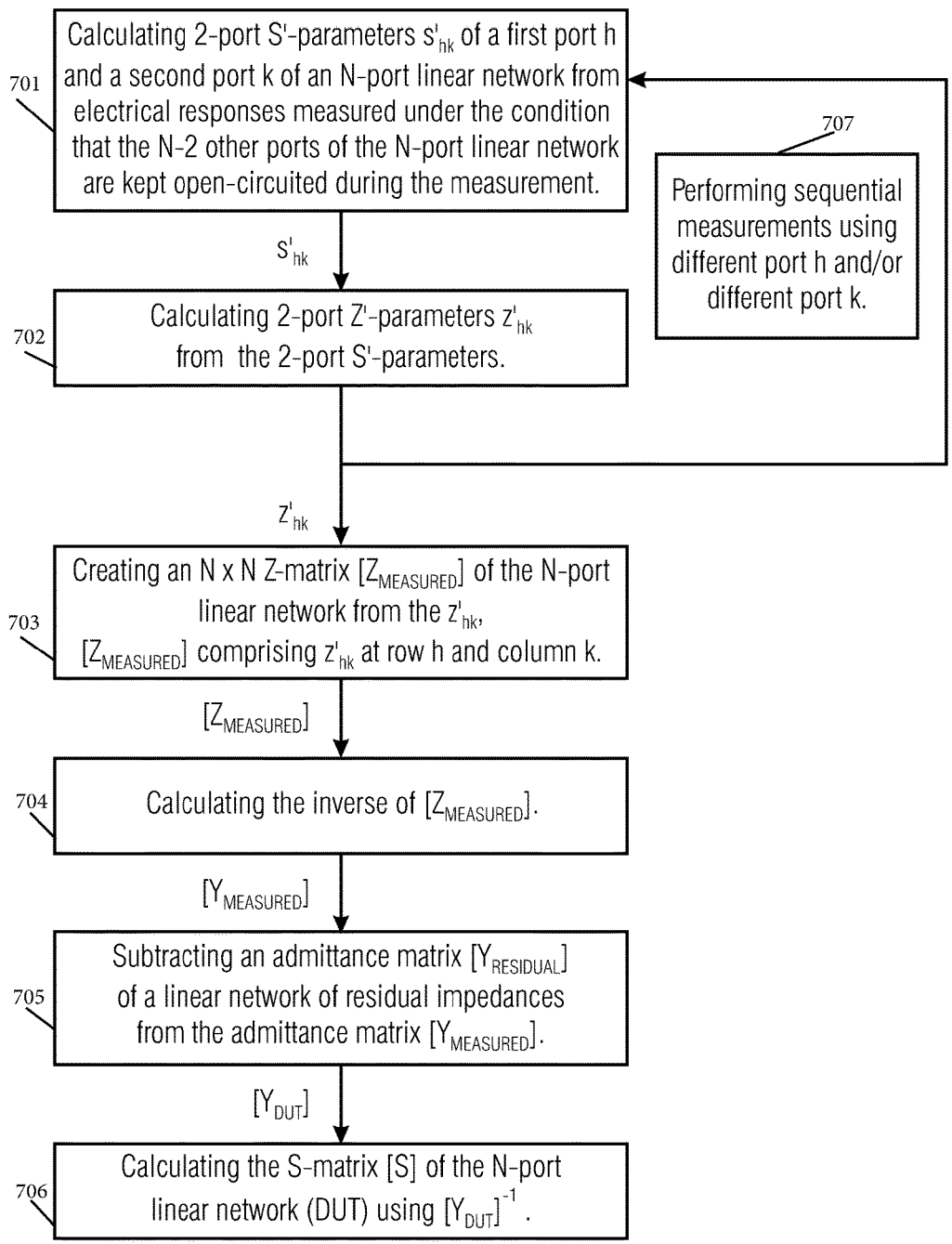
FIG. 7 shows a flow chart comprising a method according to the invention.

Conclusively, FIG. 7 is used to illustrate an exemplary inventive method which may advantageously be performed by an apparatus 7 according to the invention. First, 2-port S'-parameters $s'_{hk}$ of a first port 4, designated h, and a second port 5, designated k, of an N-port linear network 1, 8 are calculated (701) from electrical responses measured under the condition that the N−2 other ports 6a, 6b, 6c of the N-port linear network 1, 8 are kept open-circuited during the measurement. The $s'_{hk}$ obtained accordingly are used to calculate (702) 2-port Z'-parameters $z'_{hk}$. One or more sequential measurements using different ports h and/or different ports k are performed (707) in order to obtain a plurality of $z'_{hk}$. Then, an N×N Z-matrix, designated as $[Z_{MEASURED}]$ is created (703) from the $z'_{hk}$. Thus, $[Z_{MEASURED}]$ then comprises the element $z'_{hk}$ at row h and column k. After that, the inverse of $[Z_{MEASURED}]$, an admittance matrix designated $[Y_{MEASURED}]$, is calculated (704). Then, an admittance matrix $[Y_{RESIDUAL}]$ of the linear network 1, 8, as described in a previous paragraph, is subtracted (705) from the admittance matrix $[Y_{MEASURED}]$. Thus, residual impedances are de-embedded and the admittance matrix $[Y_{DUT}]$ of the N-port linear network 1, 8 comprising the first port 4, the second port 5 and the other ports 6a, 6b, 6c is obtained. Finally, the S-matrix $[S_{DUT}]$ of that N-port linear network 1, 8 is calculated (706) using $[Z_{DUT}] = [Y_{DUT}]^{-1}$ in the equation $[S_{DUT}] = \{[Z_{DUT}] - [E]R_0\}\{[Z_{DUT}] + [Z_{DUT}]R_0\}^{-1}$.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

Depending on certain implementation requirements, embodiments of the invention can be implemented in hardware or in software. The implementation can be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are advantageously performed by any hardware apparatus.

The apparatus described herein may be implemented using a hardware apparatus, or using a computer, or using a combination of a hardware apparatus and a computer.

The methods described herein may be performed using a hardware apparatus, or using a computer, or using a combination of a hardware apparatus and a computer.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. An apparatus comprising:
   a device operable to calculate one or more scattering parameters of a linear network comprising a number N of ports adapted to provide electric connections;
   wherein the device is operable to generate and apply an incident wave at a first port of the linear network;
   wherein the device is operable to measure electrical responses to the incident wave at the first port and/or at a second port of the linear network under a condition that one or more of other ports of the linear network face a reflection coefficient $\Gamma$, which is defined as $(Z-R_0)/(Z+R_0)$, with an amplitude $\rho$ of 0.5 or larger, wherein Z is a port impedance;
   wherein the device is operable to use a result of a measurement of the electrical responses at the first port and at the second port in a calculation to calculate a scattering parameter for a 2-port network formed by the first port and the second port and that are related to a reference impedance $R_0$ of the linear network; and
   wherein the device is configured to calculate one or more scattering parameters, which are related to the reference impedance $R_0$ of the linear network, on a basis of the electrical responses, wherein the scatter parameter for the 2 port network is used in order to subsequently calculate the one or more scattering parameters of the linear network on a basis of the electrical responses.

2. The apparatus according to claim 1, wherein the device is configured to calculate the one or more scattering parameters on the basis of the electrical responses measured under the condition that the one or more of the other ports of the linear network are open-circuited so that the one or more of the other ports face the reflection coefficient $\Gamma$ with the amplitude $\rho$ of 0.5 or larger.

3. The apparatus according to claim 1, wherein the device is configured to keep the one or more of the other ports of the linear network open-circuited when measuring the electrical responses to the incident wave at the one or more ports of the linear network.

4. The apparatus according to claim 1, wherein the device comprises a matched receiver, and wherein the device is configured to measure the electrical responses at the one or more ports with the matched receiver connected to a port.

5. The apparatus according to claim 1, wherein the device comprises a matched generator, and wherein the device is configured to generate the incident wave with the matched generator connected to a port.

6. The apparatus according to claim 1, wherein the device is configured to use one or more of the scattering parameters of the 2-port network formed by the first port and the second port in a calculation in order to calculate one or more impedance parameters of the 2-port network formed by the first port and by the second port in order to subsequently calculate the one or more scattering parameters of the linear network.

7. The apparatus according to claim 6, wherein the device is configured to use the one or more of the impedance parameters of the 2-port network formed by the first port and the second port to calculate the one or more scattering parameters of the linear network.

8. The apparatus according to claim 7, wherein the device is configured to calculate the one or more scattering parameters of the linear network from an impedance matrix comprising the one or more of the impedance parameters of the 2-port network formed by the first port and the second port.

9. The apparatus according to claim 1, wherein the device is configured to:
   perform sequential measurements of electrical responses of two or more 2-port networks among the N ports of the linear network in order to calculate scattering parameters of each 2-port network under the condition of keeping the other N−2 ports of the linear network open-circuited during each measurement;
   calculate the impedance parameters of the two or more 2-port networks from the calculated scattering parameters of each of the 2-port networks; and
   create a N×N impedance matrix of the linear network on the basis of impedance parameters of the two or more of the 2-port networks.

10. The apparatus according to claim 1, wherein the device is configured to mathematically transform an impedance matrix created from impedance parameters of 2-port networks into an S-matrix comprising the scattering parameters of the linear network.

11. The apparatus according to claim 1, wherein the device is configured to de-embed a residual impedance at the ports of the linear network from a S-matrix calculated for the linear network.

12. The apparatus according to claim 11, wherein the device is configured to:

calculate an admittance matrix of the linear network;
subtract admittances of residual impedances; and
calculate the S-matrix of the linear network using the inverse of the admittance matrix of the linear network.

13. The apparatus according to claim 1, wherein the number of ports of the linear network is three or more.

14. The apparatus according to claim 1, wherein the device is an S-parameter determination device.

15. The apparatus according to claim 1, wherein the device is a chip tester.

16. A method for calculating one or more scattering parameters of a linear network comprising a number N of ports adapted to provide electric connections, the method comprising:
applying an incident wave at a port of the linear network;
measuring an electrical response to the incident wave at one or more ports of the linear network under a condition that one or more of other ports of the linear network face a reflection coefficient $\Gamma$, which is defined as $(Z-R_0)/(Z+R_0)$, with an amplitude $|\Gamma|$ of 0.5 or larger, wherein Z is a port impedance;
calculating the one or more scattering parameters, which are related to a reference impedance $R_0$ of the linear network, on a basis of the electrical response;
calculating an admittance matrix of the linear network;
subtracting admittances of residual impedances;
calculating an S-matrix of the linear network using the inverse of the admittance matrix of the linear network; and
de-embedding a residual impedance at the ports of the linear network from a S-matrix calculated for the linear network.

17. A non-transitory digital storage medium having a computer program stored thereon to perform a method for calculating one or more scattering parameters of a linear network comprising a number N of ports adapted to provide electric connections, the method comprising:
applying an incident wave at a first port of the linear network;
measuring an electrical responses to the incident wave at the first port and/or at a second port of the linear network under a condition that one or more of other ports of the linear network face a reflection coefficient $\Gamma$, which is defined as $(Z-R_0)/(Z+R_0)$, with an amplitude $|\Gamma|$ of 0.5 or larger, wherein Z is a port impedance;
using a result of a measurement of the electrical responses at the first port and at the second port in a calculation to calculate a scattering parameter for a 2-port network formed by the first port and the second port and that are related to a reference impedance $R_0$ of the linear network; and
calculating the one or more scattering parameters, which are related to a reference impedance $R_0$ of the linear network, on a basis of the electrical response, wherein the scatter parameter for the 2 port network is used to subsequently calculate the one or more scattering parameters of the linear network on a basis of the electrical responses.

* * * * *